United States Patent [19]

Ubbens

[11] Patent Number: 5,205,683
[45] Date of Patent: Apr. 27, 1993

[54] DEVICE FOR WORKING PLATE-SHAPED MEMBERS

[76] Inventor: Henricus D. Ubbens, Ministerlaan 38, 5631 Nd Eindhoven, Netherlands

[21] Appl. No.: 927,243

[22] Filed: Aug. 7, 1992

Related U.S. Application Data

[63] Continuation of Ser. No. 677,404, Mar. 28, 1991, abandoned.

[30] Foreign Application Priority Data

Apr. 3, 1990 [NL] Netherlands .................. 9000777

[51] Int. Cl.$^5$ ............................................. B23B 39/16
[52] U.S. Cl. ...................................... 408/46; 408/50; 408/53
[58] Field of Search .............. 408/43, 44, 46, 49, 408/50, 51, 53, 62, 69, 70

[56] References Cited

U.S. PATENT DOCUMENTS

| | | | |
|---|---|---|---|
| 2,080,643 | 5/1937 | Walther | 408/46 |
| 3,288,182 | 11/1966 | Jameson | 408/50 |
| 3,822,958 | 7/1974 | Lewis | 408/46 |

FOREIGN PATENT DOCUMENTS

| | | | |
|---|---|---|---|
| 1169110 | 4/1964 | Fed. Rep. of Germany | 408/69 |
| 2143629 | 3/1973 | Fed. Rep. of Germany | . |
| 2223473 | 11/1973 | Fed. Rep. of Germany | 408/44 |
| 2704415 | 8/1978 | Fed. Rep. of Germany | 408/43 |
| 3406367 | 8/1985 | Fed. Rep. of Germany | 408/69 |
| 2089119 | 1/1972 | France | . |
| 2585607 | 2/1987 | France | 408/46 |
| 59-196104 | 11/1984 | Japan | . |
| 218007 | 9/1987 | Japan | 408/53 |

*Primary Examiner*—Daniel W. Howell
*Attorney, Agent, or Firm*—Ladas & Parry

[57] ABSTRACT

The invention relates to a device for working plate-shaped members, provided with a frame having means for supporting said plate-shaped members and with tool holders supported by said frame, said tool holders carrying tools intended for working on the plate-shaped members, whereby the tool holders are adjustable independently of each other in two directions extending transversely to each other, at least substantially parallel to the plate-shaped members with respect to the plate-shaped members supported by the frame, whereby conveying means are provided, by means of which the plate-shaped members are stepwise movable, parallel to themselves, in succession with respect to the tool holders in the device at least over a distance substantially equal to the distance over which a tool holder can be displaced in a direction parallel to the intended direction of movement of the plate-shaped members.

15 Claims, 9 Drawing Sheets

DEVICE FOR WORKING PLATE-SHAPED MEMBERS

This is a continuation of co-pending application Ser. No. 07/677,404 filed Mar. 28, 1991, now abandoned.

The invention relates to a device for working plate-shaped members, provided with a frame having means for supporting said plate-shaped members and with tool holders supported by said frame, said tool holders carrying tools intended for working on the plate-shaped members, whereby the tool holders are adjustable independently of each other in two directions extending transversely to each other, at least substantially parallel to the plate-shaped members with respect to the plate-shaped members supported by the frame.

Such a device is known from U.S. Pat. No. 3,822,958. With this known device a plate-shaped member to be worked on is clamped down on a table arranged under the tool holders formed by the drill heads, after which bores are provided at desired locations in the plate-shaped member by means of the tool holders set in the required positions. After the required bores have been provided in the plate-shaped member said plate-shaped member is removed from the device and a new plate-shaped member is arranged in the device.

From French Patent Specification No. 2,089,119 a drilling device is furthermore known provided with a few tool holders formed by drill heads, which are arranged in a row, a required number of which can be moved downwards in the direction of a plate-shaped member, which is clamped in place on a table disposed under the drill heads. The table on which the plate-shaped member is clamped down is adjustable in two directions extending perpendicularly to each other, so as to be able to provide a required pattern of holes in the plate-shaped member by said drill heads arranged in a row. After the required pattern of holes has thus been provided in the plate-shaped member, said plate-shaped member may be removed from the table, after which a new plate-shaped member to be worked on can be clamped down on the table.

With these known devices each time a single plate-shaped member is worked on in the machine, therefore, in order to be removed from the machine after the intended operation has been completed, after which a new plate-shaped member can be set up in the machine. Consequently the applications and the production capacity of these known devices are comparatively low.

According to the invention conveying means are provided, by means of which the plate-shaped members are stepwise movable in one direction, parallel to themselves, in succession with respect to the tool holders in the device at least over a distance substantially equal to the distance over which a tool holder can be displaced in a direction parallel to the intended direction of movement of the plate-shaped members.

When using the construction according to the invention the plate-shaped members to be worked on can be intermittently moved in succession through the machine, whereby a possibility has been created to work on a single plate-shaped member and/or several plate-shaped members simultaneously, and whereby at the same time it is not necessary to stop the device in order to exchange plate-shaped members. By using the construction according to the invention a considerable increase of the capacity of the device can be obtained, therefore, in comparison with the conventional devices for working plate-shaped members.

Further supporting means for supporting a tool holder can be arranged on both sides of the tool holder, whereby tilting of the tool holder during operation is prevented and a more accurate working can be obtained.

Although in the present application mention is made of a plate-shaped member or a circuit board, it is to be understood that it is also possible that several stacked plate-shaped members or circuit boards are worked on simultaneously.

The invention will be further explained hereafter with reference to an embodiment of a device according to the invention diagrammatically illustrated in the accompanying Figures.

Figure 1:
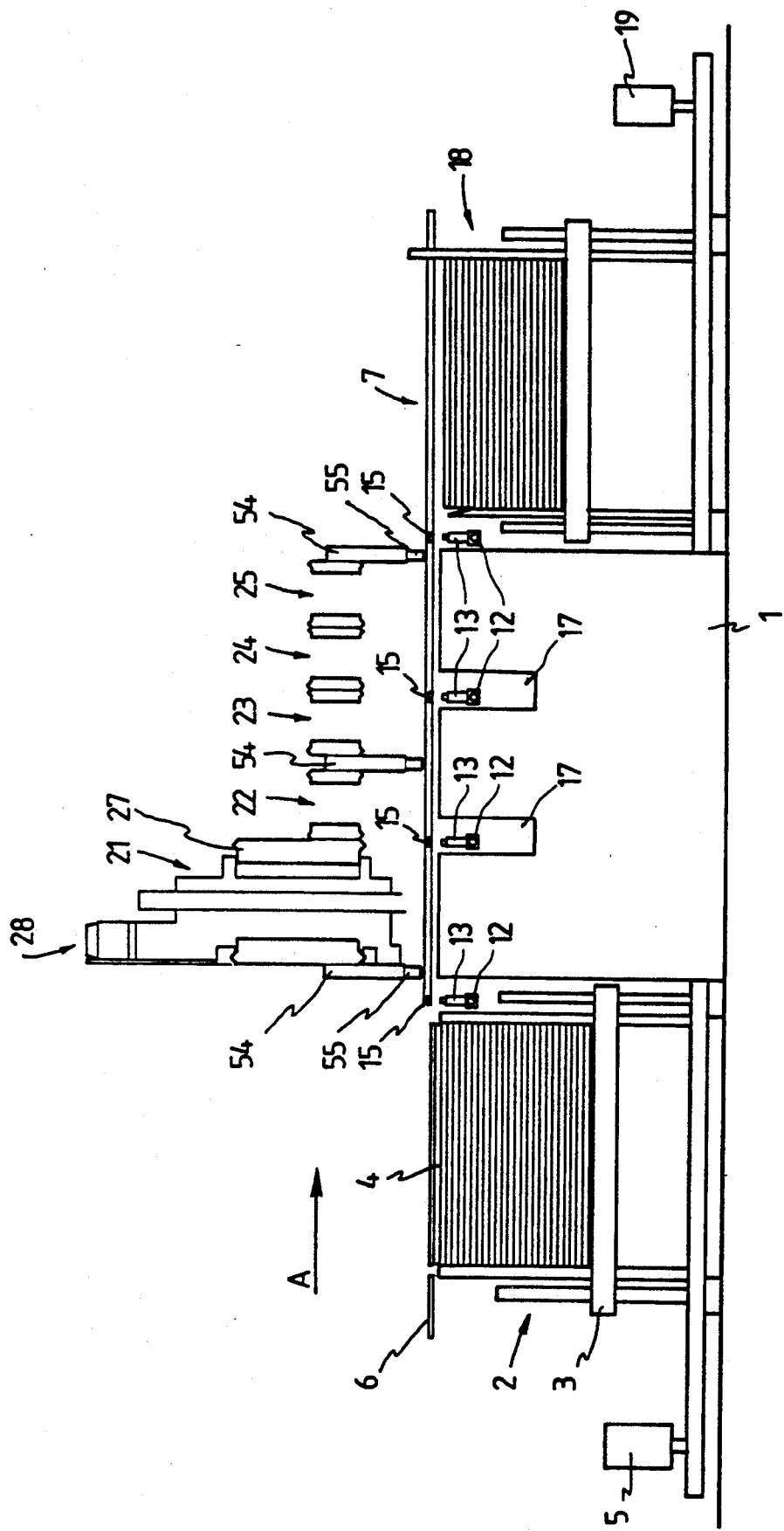
FIG. 1 is a diagrammatic side elevational view of a device according to the invention, wherein only one tool carrier supporting a tool holder is diagrammatically indicated.
Figure 2:
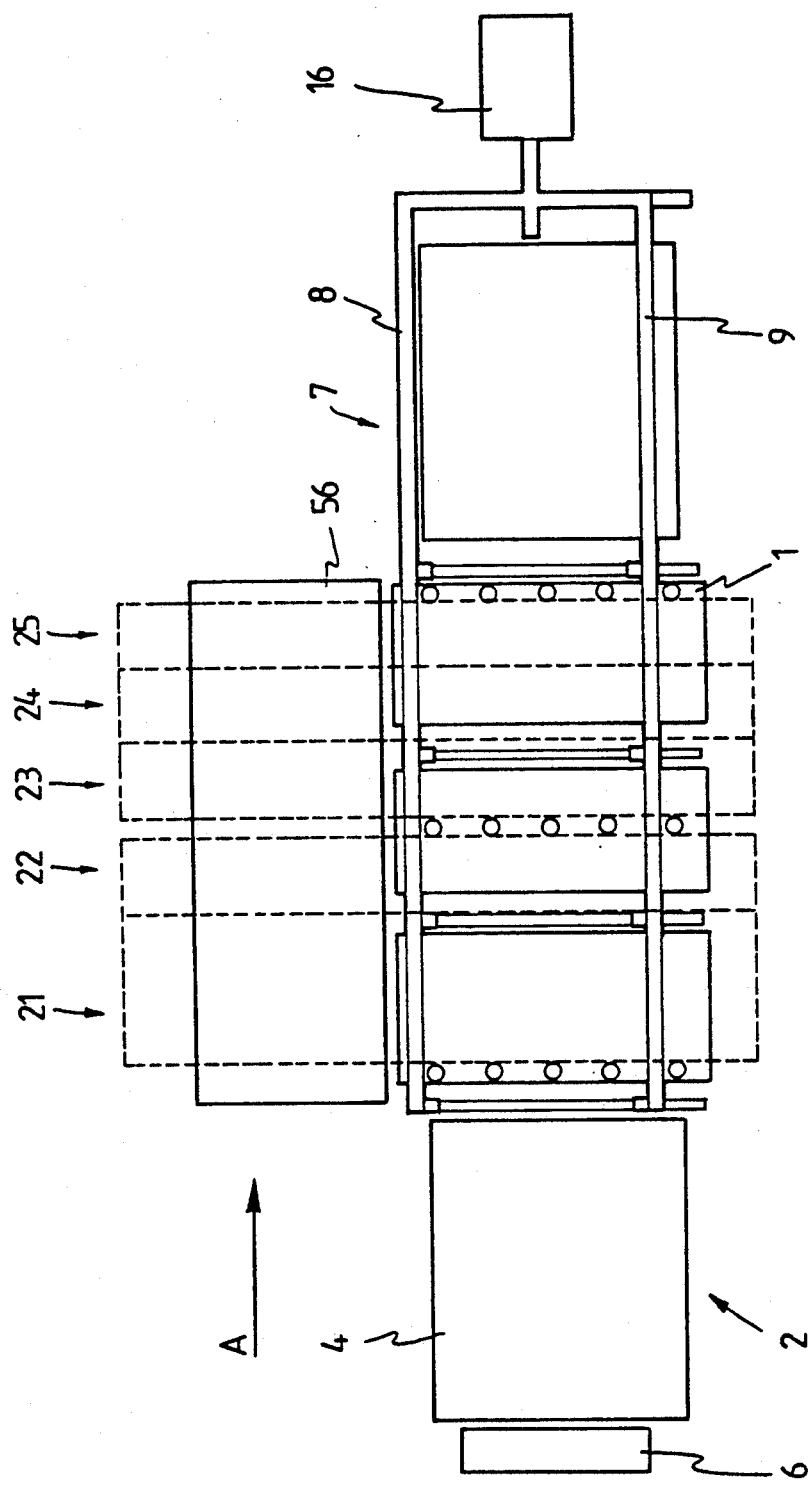
FIG. 2 is a plan view of FIG. 1, wherein the bridges for the tool holders formed by the guide beams are only indicated by means of dotted lines, so as to be able to show the parts located thereunder more clearly.

The device illustrated in FIGS. 1 and 2 comprises a work table 1. To the left of the work table 1, when seen in FIG. 1, there is disposed a magazine attachment 2, which has a raising platform 3, on which a number of plate-shaped members 4 to be worked on, such as circuit boards, are stacked. Said raising platform 3 can be moved upwards by a driving means 5, in a manner known per se. Since the construction of such a lifting mechanism does not form part of the invention, it is not considered necessary to discuss it in more detail.

A pushing means 6, which is indicated only diagrammatically, is disposed at the side of the magazine attachment 2 remote from the work table 1, by which pushing means 6 the upper plate 4 of the stack can be moved towards the work table, in the direction according to the arrow A at a required point of time.

Figure 8:
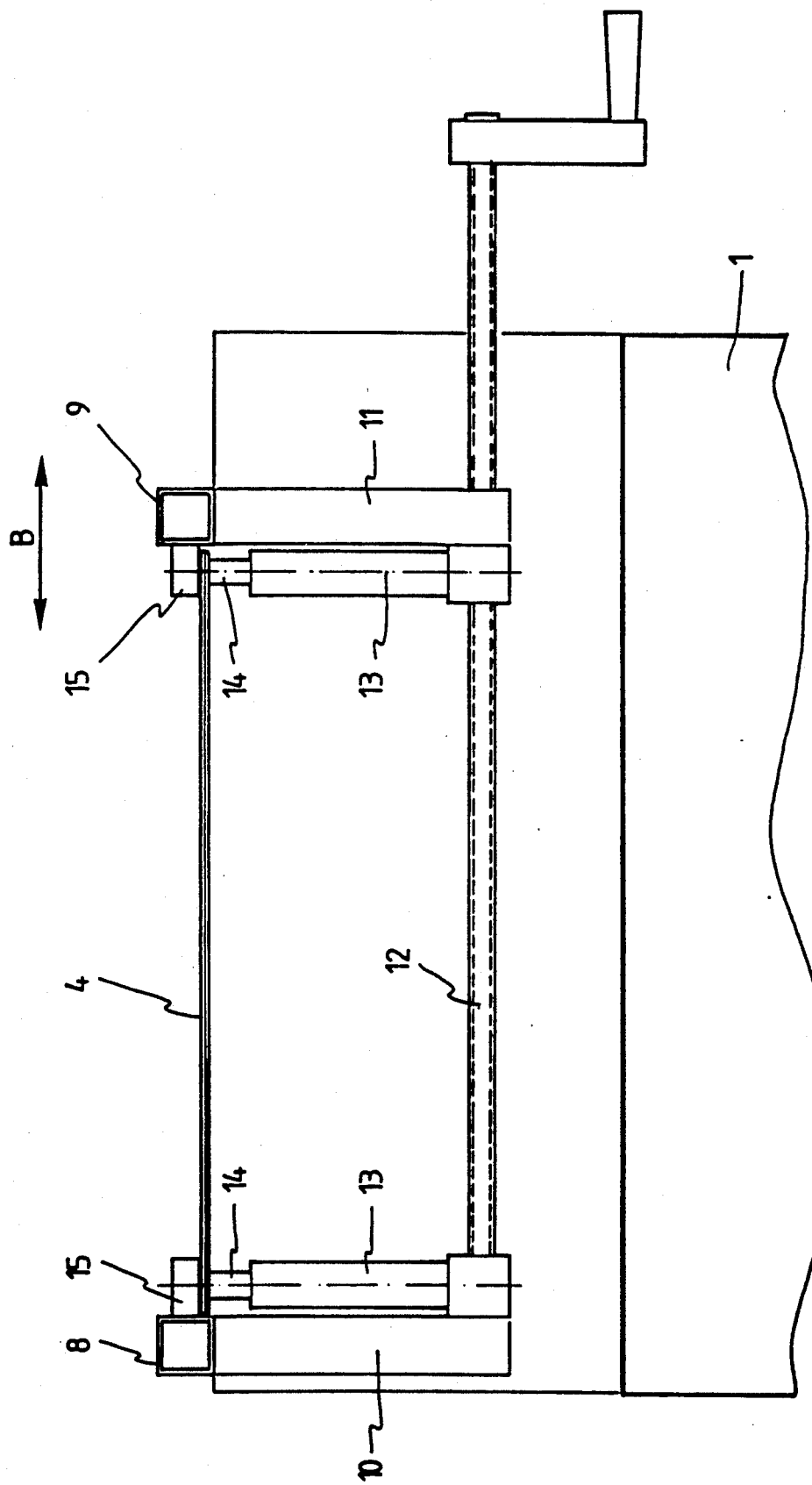
FIG. 8 is a diagrammatic view of a part of the conveying mechanism of the device illustrated in FIGS. 1 and 2.
Figure 9:
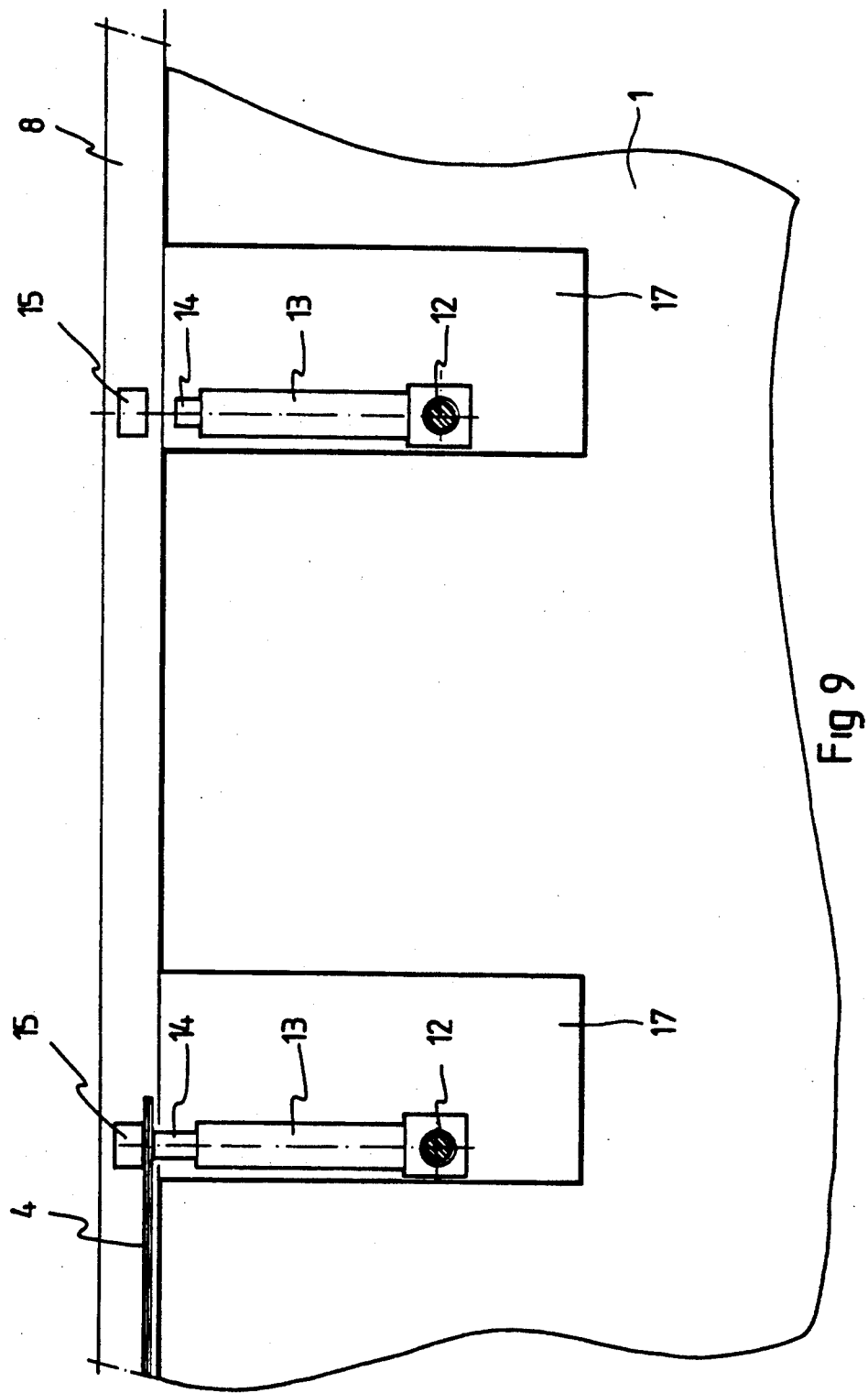
FIG. 9 is a sectional view of FIG. 8.

A conveying mechanism is 7 provided so as to move the plates 4 through the device in the direction according to the arrow A, said conveying mechanism being provided with a pair of beams 8 and 9 extending parallel to the direction of movement according to the arrow A. Said beams 8 and 9 are located at a higher level than the upper surface of the work table 1, as is apparent from FIG. 1. Downwardly extending arms 10 and 11 respectively are attached to each of said beams 8 and 9 in four spaced apart points (FIG. 8). The lower ends of each pair of arms 10 and 11 are interconnected by a connecting means 12 extending horizontally and perpendicularly to the longitudinal direction of the beams 8 and 9, which connecting means 12, as is diagrammatically depicted in FIG. 8, may be a screwed spindle, by means of which the beam 9 can be moved in the direction according to the double arrow B towards the beam 8 or away from the beam 8, so as to adjust the distance between the beams 8 and 9 to the width of the plate-shaped members 4 to be worked on.

To the lower ends of the arms 10 and 11, at the sides of said arms 10 and 11 directed towards each other, there are provided setting cylinders 13 extending parallel to the arms 10 and 11, said arms being provided with vertically adjustable plungers 14. The upper ends of said plungers 14 co-operate with stops 15 attached to the beams 8 and 9 so as to clamp down between said stops plates 4 to be moved by means of the conveying mechanism 7.

The conveying mechanism 7 can be moved to and fro parallel to the intended direction of this placement of the plates 4 in the direction according arrow A by means of a driving member 16 which is shown only diagrammatically in FIG. 2.

A few of the cross connections 12 are accommodated in recesses 17 provided in the table 1, so as to enable the conveying mechanism 7 to make said reciprocating movement.

A magazine 18 for receiving worked-on plates 4 is provided at the side of the table 1 remote from the magazine 2. Also this magazine 18 is equipped with a table 20 which is vertically adjustable by way of a driving means 19, said table 20 being moved downwards in steps when plates 4 are supplied, so that successive plates can respectively be pushed on the stack already present on the table 20 without failure.

A number of bridges, five bridges 21–25 in the illustrated embodiment, for supporting the working means are disposed above the table 1. In FIG. 2 the outside contours of said bridges are only indicated by dotted lines, so as to be able to illustrate parts located thereunder.

Figure 4:
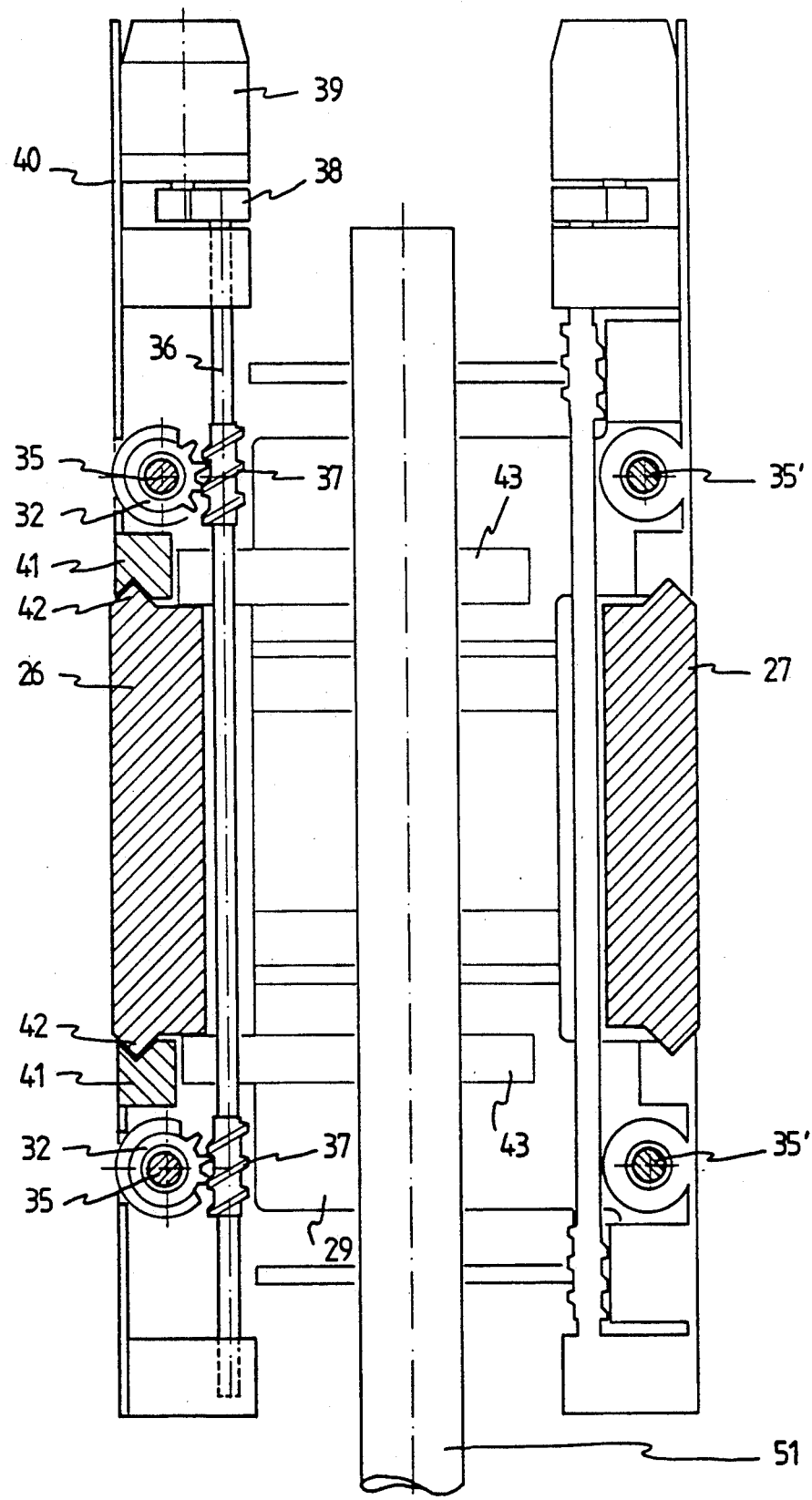
FIG. 4 is a cross-sectional view of FIG. 3, along the line IV—IV in FIG. 3.
Figure 5:
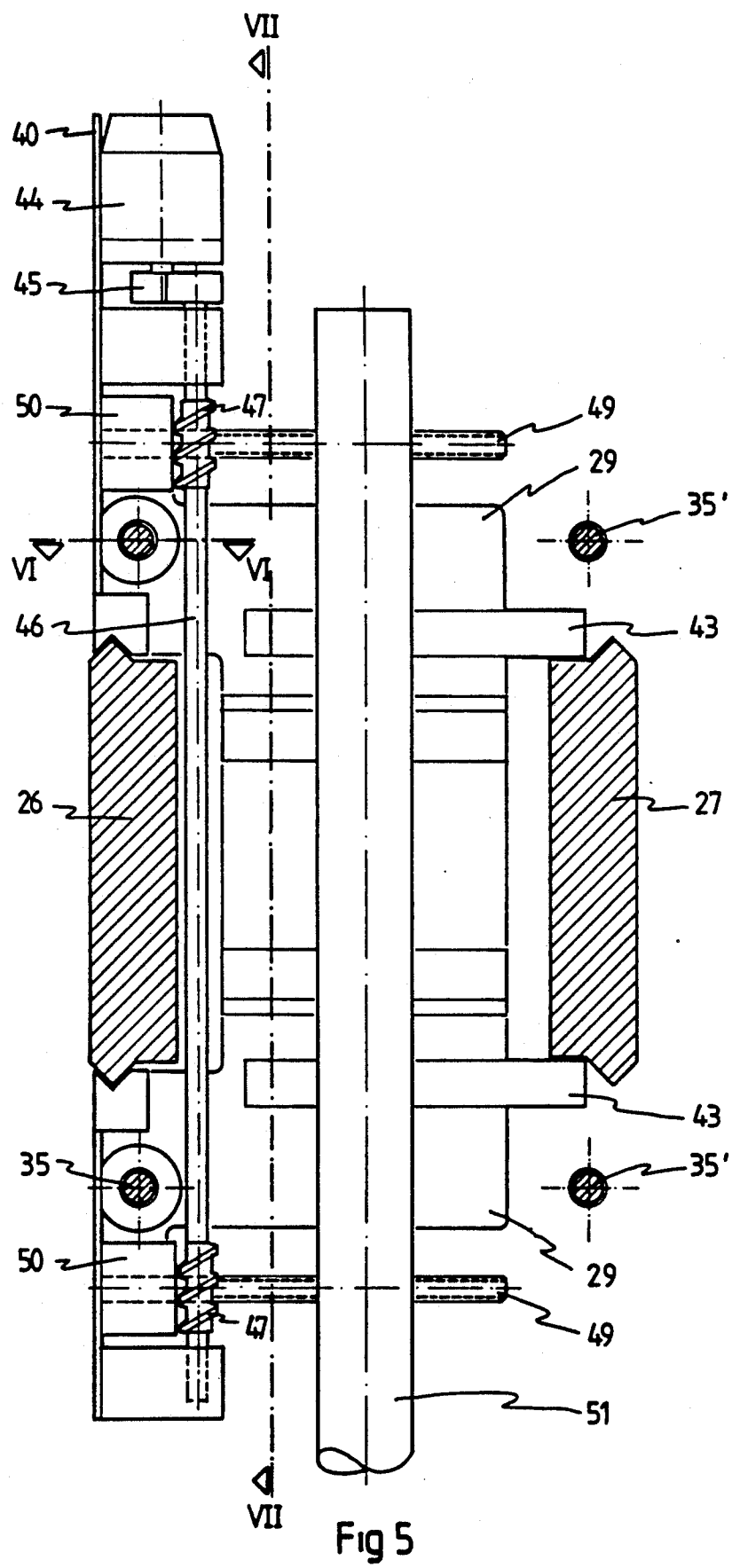
FIG. 5 is a cross-sectional view of FIG. 3, along the line V—V in FIG. 3.
Figure 6:
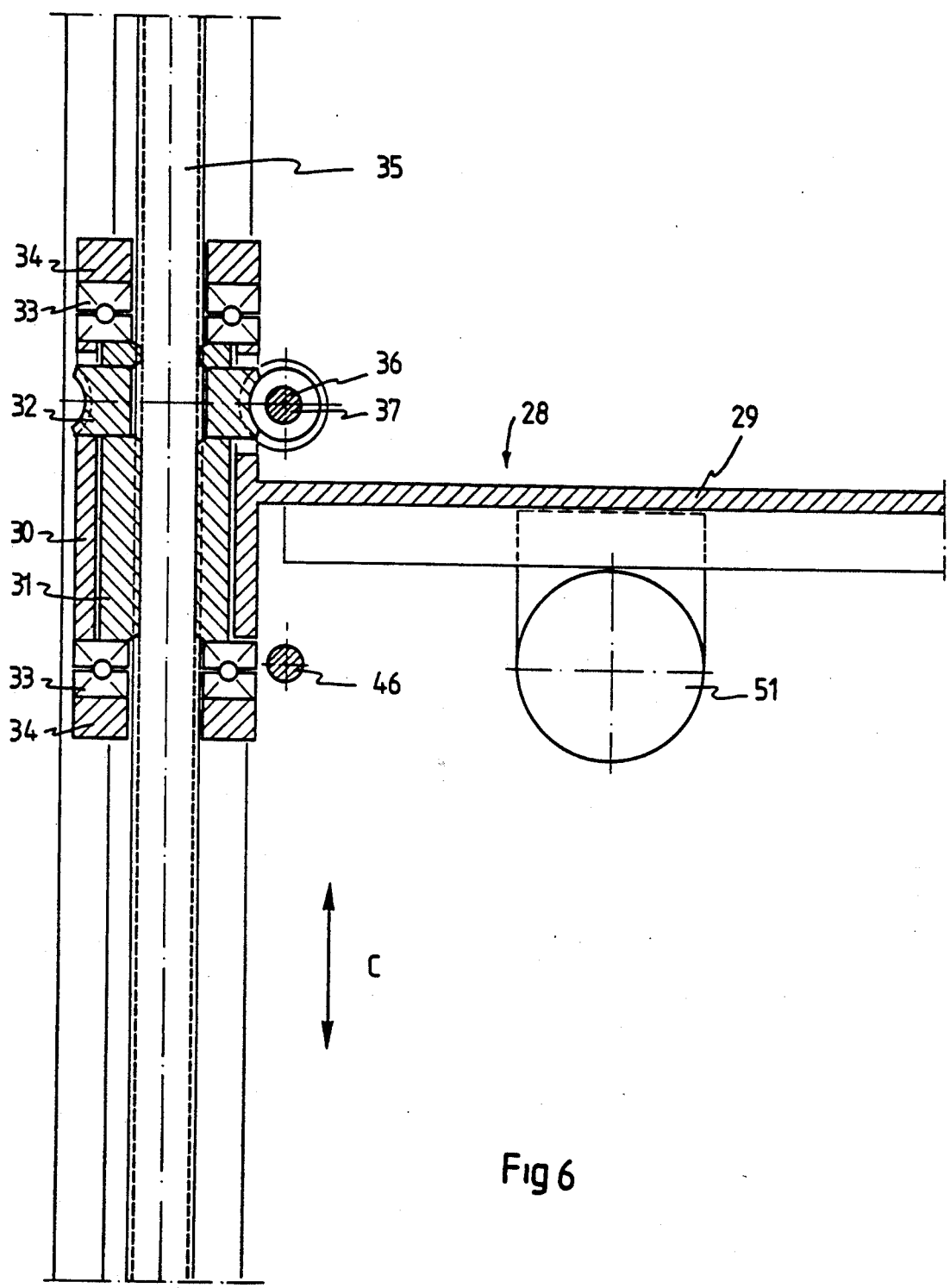
FIG. 6 is a larger-scale sectional view of FIG. 5, along the line VI—VI in FIG. 5.

As is illustrated in more detail in FIGS. 3–7, each bridge comprises two spaced apart guide beams 26 and 27, said guide beams extending perpendicularly to the intended direction of movement of the plates according to the arrow A. The guide beams 26 and 27 associated with a bridge support a plurality of tool carriers 28. Each tool carrier comprises a vertical plate-shaped carrier 29. Near the upper side and the lower side of one side of the plate-shaped carrier there are attached bushes 30, whose horizontally extending axes extend perpendicularly to the plate-shaped carrier 29 (FIG. 6). Each of said bushes 30 accommodates a nut-shaped means 31, which is connected to a worm wheel 32. The combination of nut 31 and worm wheel 32 is retained between two thrust bearings 33. The aggregate is secured against axial displacement in the longitudinal direction of the central axis of the bush 30 by retaining plates 34, which are located at sides of the thrust bearings 33 directed away from each other and which are connected to the support 29.

The nut-shaped means 31 co-operate with screwed spindles 35 which are passed through said nut-shaped means and which extend parallel to the guide beams 26 and 27, said screwed spindles being disposed above or under the guide beam 26 of the bridge in question. The screwed spindles 35 are thereby supported by the frame of the device in such a manner (not shown) that they are not rotatable about their central axis, and that they are not movable in axial direction either.

As is further illustrated in FIG. 4 the two worm wheels 32 are in engagement with worms 37 mounted on a vertically upright shaft 36. For the sake of clarity the pinions 33 and the worms 37 are shown to have a rather coarse screw thread in the Figures, in practice, however, a very fine screw thread will be used so as to be able to effect an accurate rotation in small steps of the worm wheels and the nuts 31 attached thereto.

The upper end of the vertically upright shaft 36 crossing the screwed spindles 35 perpendicularly is connected, via a gear transmission 38, to the outgoing shaft of a driving motor, preferably an electromotor 39, which is mounted on a supporting plate 40 connected to the supporting plate 29.

It will be apparent that when the reversible motor 39 is put into operation the shaft 36, and thus also the worm wheels 32 and the nut-shaped means 31 attached thereto, will be set rotating. When the nut-shaped means 31 rotate about the stationary screwed spindles 35 the tool carrier 28 in question will be moved along the guide beams 26 and 27 in the one or the other direction, as is indicated by means of the double arrow C (FIGS. 3, 6).

Supporting blocks 41 extending parallel to the beam 26 are thereby secured to the plate-shaped support 29, so as to support the tool carrier 28 on the beam 26. At their sides directed towards each other said supporting blocks 41 are provided with notches having a triangular section, correspondingly shaped noses 42 of the beam 26 engaging said notches. Two arms 43 extending at least substantially parallel to said plate-shaped support are furthermore attached to the plate-shaped support 29, whereby the free ends of said arms 43 co-operate with a lower or upper boundary side, as the case may be, of the beam 27 (FIG. 5).

Figure 3:
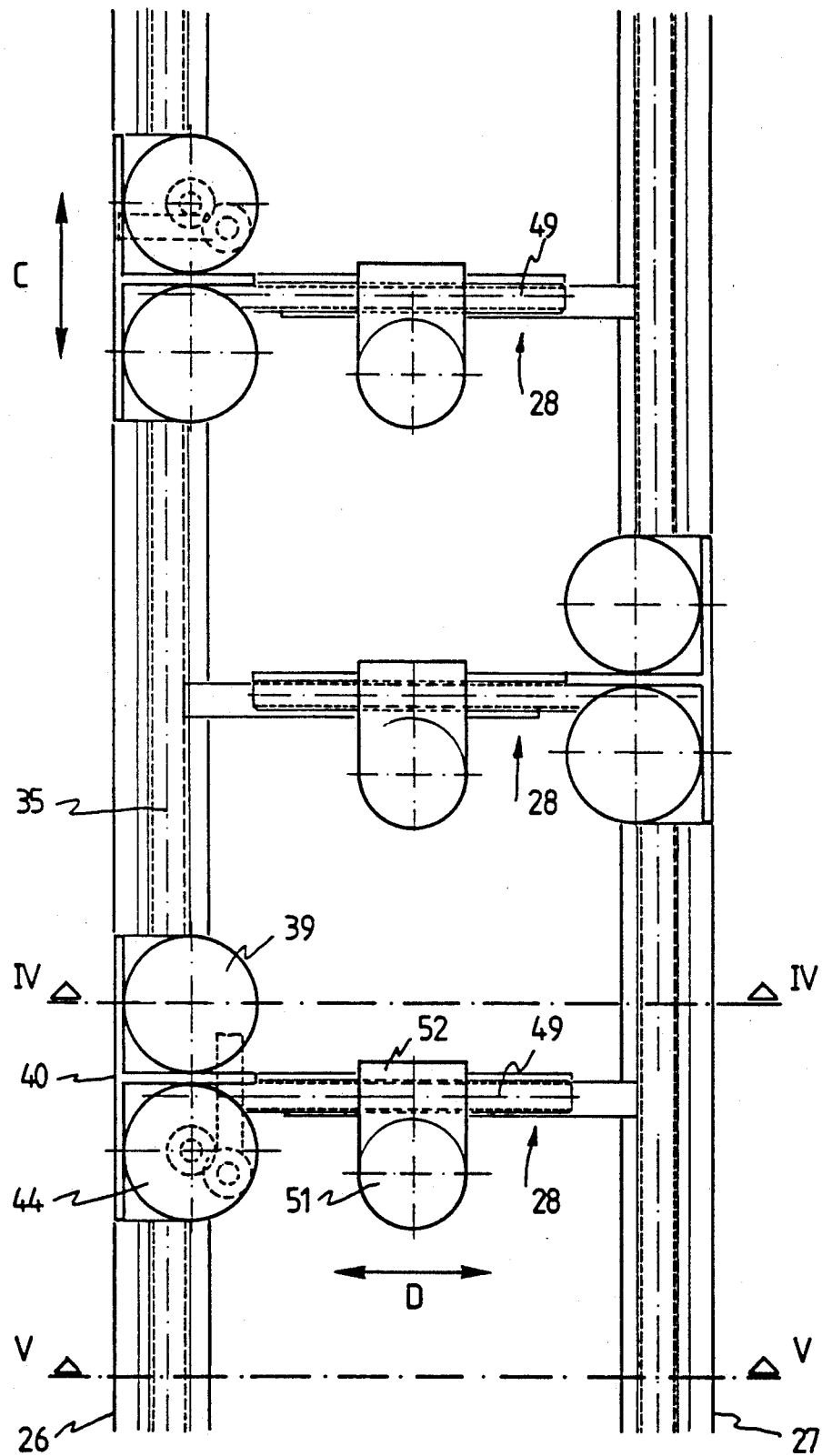
FIG. 3 is a larger-scale plan view of a bridge formed by a pair of guide beams, with a few tool holders and tool carriers supported by said bridge.

It is noted thereby that, as appears from FIG. 3, the successive tool carriers 28 supported by the guide beams 26 and 27 of a bridge are disposed in a diametrically opposite position with respect to each other, as appears from FIG. 3, so that for the one tool carrier the supporting blocks 41 co-operate with a guide beam 26 and for the other tool carrier with a guide beam 27. The same applies to the arms 43. Above and under the beam 27 there are furthermore provided screwed spindles 35' for the displacement of the tool carriers 28 in question.

Figure 7:
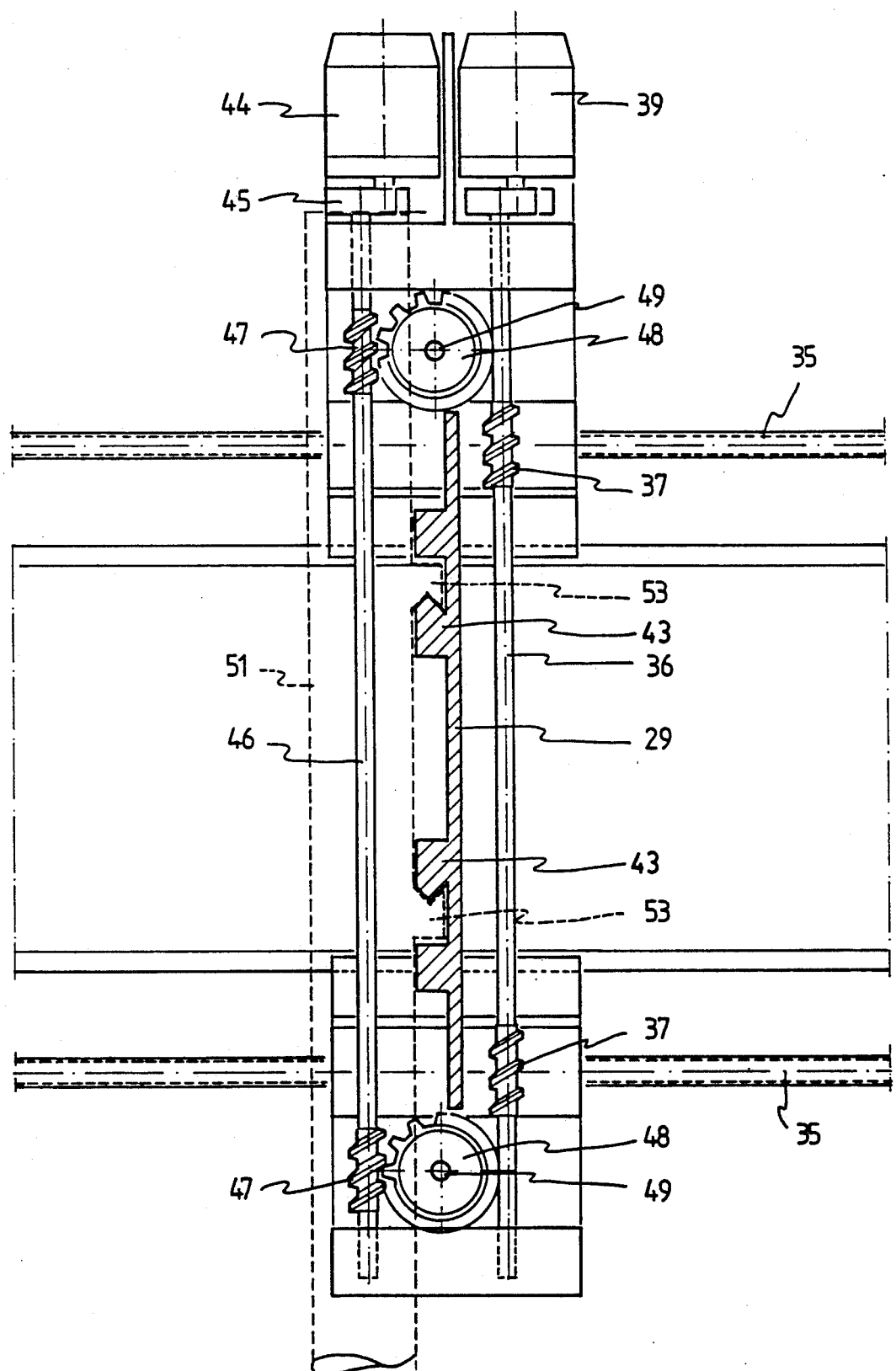
FIG. 7 is a sectional view of FIG. 5, along the line VII—VII in FIG. 5.

As appears in particular from FIG. 7 a second motor, preferably an electromotor 44, is mounted on the plate 40. Said electromotor 44 is in turn connected, via a gear transmission 45, to a shaft 46 extending parallel to the shaft 36. Worms 47 are attached to the shaft 46 in points located above and under the supporting plate 29. Said worms are in engagement with worm wheels 48, which are secured to horizontally extending screwed spindles 49, which cross the vertically upright shafts 36 and 46 perpendicularly. Said screwed spindles are supported freely rotatably thereby, in bushes 50 connected to the supporting plate 29, whilst the spindles 49 are secured against axial displacement. Also here the worms 47 and the worm wheels have fine teeth.

As is illustrated in FIG. 3 the spindles 49 are screwed into nut-shaped means 52 secured to a diagrammatically illustrated tool holder 51. By operating the reversible motor 44 of a working means 28 the tool holder 51 can be moved to and fro, as is indicated by means of the double arrow D.

The diagrammatically illustrated tool holder 51 may e.g. be a drilling spindle with an associated driving means, so that the device is suitable for drilling holes in the plate-shaped means. Of course it will also be possible, however, to use other tools in the device according to the invention.

As is furthermore diagrammatically indicated in FIG. 7 the plate-shaped support 29 may be provided with profiled guide ribs 43, so as to guide the tool holder 51 during its movement in the direction according to the arrow D, (FIG. 3) said guide ribs 43 co-operating with corresponding guide means 53 attached to the tool holder.

As is furthermore illustrated in FIG. 1 setting cylinders 54 corresponding with the setting cylinders 13 are secured to the bridges, in points located one behind the other, when seen in the intended direction of movement, said setting cylinders 54 occupying a position turned through 180° with respect to the position of the setting cylinders 13.

From FIG. 2 it furthermore appears that the bridges 21-25 extend as far as a table 56 disposed beside the table 1, which table 56 may be used for arranging exchangeable tools to be connected to the tool holders 28, such as drills.

The operation of the device is as follows.

A plate 4 to be worked on may be moved in the direction according to the arrow A, by the pushing means 6, into a position in which the front end of the pushing means is located between the setting cylinders located furthest to the left, when seen in FIG. 1, and the stops 15 disposed thereabove. Then the front edge of the plate in question can be clamped down between the plungers 14 of the setting cylinders 13 and the stops 15 located thereabove. Subsequently the plate 4 may be moved further to the right by means of the conveying mechanism 7. At the end of the stroke of the conveying mechanism the plate in question can be clamped down on the table 1 by mans of the plungers 55 of the setting cylinders 54. After that the plungers 14 of the setting cylinders 13 may be retracted and the setting mechanism may be moved in the direction opposite arrow A back to its initial position. In this initial position the plate 4 may be clamped down on the conveying mechanism 7 again and the plate can be moved another step by means of the conveying mechanism 7, after the plungers 55 of the setting cylinders 54 have been retracted.

Preferably the arrangement is so that in each step the plate 4 can be moved over a distance substantially equal to the distance over which a bridge can be displaced in a direction parallel to the direction wherein the plates 4 are displaced.

Thereby the drive could be so that said distance is adjustable.

It will be apparent that in this manner the plate-shaped means 4 can be moved in steps across the table 1, in the direction according to the arrow A. When a plate 4 has thereby assumed a position on the table 1 suitable for carrying out a working operation the operation in question may take place by means of the required tools carried by the tool holders 51, after the plate has been clamped down on the upper surface of the table 1 by means of the setting cylinders 54.

From the above it will be apparent that each tool holder 51 can be moved independently of the other tool holders 51, by selectively operating the motors 39 and 44 associated with the tool holder in question in the direction according to the arrow C and/or the arrow D, so as to put the tool holder in question in an intended position above the plate-shaped member 4. A plate-shaped member may thereby be simultaneously worked on by means of several tools carried by the tool holders 51.

The dimensions of the bridges 21-25, in particular the width of the bridges, may be adapted to the size of the tool holders 51, which may have mutually different dimensions, dependent on the tools to be supported.

In order to be able to move the tool holders 51 into the required set positions in a fast manner, while preventing the occurrance of vibrations as much as possible, the control of the tool holders can be arranged such that several tool holders to be moved in longitudinal direction and/or in transverse direction with respect to the table 1 can be moved opposite to each other in the direction in question.

I claim:

1. A device for working plate-shaped members comprising:
   a frame;
   conveying means on said frame for supporting plate-shaped members and for stepwise moving the plate-shaped members along a path extending in a predetermined direction;
   a plurality of tool holders vertically displaced from the plate-shaped members and substantially arranged in a row in a direction transverse to said predetermined direction and carrying tools for working on the plate-shaped members;
   a carrier for each said tool holder, including means for supporting and adjustably moving said tool holder along said carrier a limited distance in a direction parallel to said predetermined direction, each said tool holder being adjustable along its corresponding carrier independent of the other tool holders; and
   elongated support means supported by said frame, said support means situated at substantially the same vertical level as said tool holders and extending lengthwise in a direction transverse to said predetermined direction, said support means including means for supporting and adjustably moving said carriers independent of each other along said support means in a direction transverse to said predetermined direction; and wherein
   said conveying means comprises means for moving the plate-shaped member stepwise in said predetermined direction with respect to said tool holders over a distance smaller than or substantially equal to said limited distance.

2. A device according to claim 1, wherein each tool holder is provided in such a manner that the entire width of a plate-shaped member can be covered transversely to its direction of movement by the tool holder.

3. The device as claimed in claim 1, comprising a plurality of said rows of tool holders located side-by-side along said predetermined direction.

4. The device as claimed in claim 1, wherein each said carrier is supported near each of its ends by one of said elongated support means.

5. A device according to claim 4, wherein said carrier is provided with guides along which said tool holder is movable in said predetermined direction.

6. A device according to claim 1, wherein, for the displacement of a carrier along its elongated support means, a pair of non-rotatable screwed rods, extending in the longitudinal direction of said elongated support means, is arranged vertically adjacent said elongated support means, said carrier being provided with two nut-shaped means cooperating with said screwed rods, which nut-shaped means can be rotated by means of a motor mounted on the carrier.

7. A device according to claim 6, wherein said pair of screwed rods are arranged one above and one under said elongated support means.

8. A device according to claim 1, wherein, for the stepwise displacement of the plate-shaped means through the device, there has been provided a frame part which is reciprocally movable in the direction of movement of the plate-shaped means, said frame part being provided with clamping means which are spaced apart in the direction of movement, by means of which a plate-shaped means can be clamped down on the reciprocally movable frame part.

9. A device according to claim 1, wherein said device is provided with clamping means, with the aid of which a plate-shaped means can be clamped down in the frame, in a position intended for working on the plate-shaped means.

10. A device according to claim 8, wherein said clamping means are adjustable with respect to each other, so as to adapt the position of the clamping means to the dimensions of the plate-shaped means.

11. A device according to claim 1, wherein: upstream of the conveying means supplying means are provided so as to supply the plate-shaped means to the conveying means; and downstream of the conveying means discharge means are provided so as to discharge the worked-on plate-shaped means from the conveying means.

12. The device as claimed in claim 1 wherein each said elongated support means is an elongated plate-like guide beam fixedly attached to said frame.

13. The device as claimed in claim 1, wherein said conveying means includes means for effecting reciprocating stepwise movement of the plate-shaped members along said path.

14. A device for working plate-shaped members comprising:
- a frame;
- conveying means on said frame for supporting plate-shaped members and for stepwise moving the plate-shaped members along a path extending in a predetermined direction;
- a plurality of tool holders vertically displaced from the plate-shaped members and substantially arranged in a row in a direction transverse to said predetermined direction and carrying tools for working on the plate-shaped members;
- a carrier for each said tool holder, said carrier being situated at substantially the same level as said tool holder and including means for supporting and adjustably moving said tool holder along said carrier a limited distance in a direction parallel to said predetermined direction, each said tool holder being adjustable along its corresponding carrier independent of the other tool holders; and
- elongated support means supported by said frame, said support means situated at substantially the same vertical level as said tool holders and extending lengthwise in a direction transverse to said predetermined direction, said support means including means for supporting and adjustably moving said carriers independent of each other along said support means in a direction transverse to said predetermined direction; and wherein
- said conveying means comprises means for moving the plate-shaped member stepwise in said predetermined direction with respect to said tool holders over a distance smaller than or substantially equal to said limited distance.

15. A device for working plate-shaped members comprising:
- a frame;
- conveying means on said frame for supporting plate-shaped members and for stepwise moving the plate-shaped members along a path extending in a predetermined direction;
- a plurality of tool holders vertically displaced from the plate-shaped members and substantially arranged in a row in a direction transverse to said predetermined direction and carrying tools for working on the plate-shaped members;
- a carrier for each said tool holder, including means for supporting and adjustably moving said tool holder along said carrier a limited distance in a direction parallel to said predetermined direction, each said tool holder being adjustable along its corresponding carrier independent of the other tool holders; and
- elongated support means supported by said frame, said support means situated at substantially the same vertical level as said tool holders and extending lengthwise in a direction transverse to said predetermined direction, said support means including means for supporting and adjustably moving said carriers independent of each other along said support means in a direction transverse to said predetermined direction; and
- drive means extending along and vertically arranged adjacent said elongated support means for displacing the carriers along said elongated support means; and wherein
- said conveying means comprises means for moving the plate-shaped member stepwise in said predetermined direction with respect to said tool holders over a distance smaller than or substantially equal to said limited distance.

* * * * *